United States Patent
Park et al.

(10) Patent No.: US 7,680,162 B2
(45) Date of Patent: Mar. 16, 2010

(54) LONG WAVELENGTH VERTICAL CAVITY SURFACE EMITTING LASER DEVICE AND METHOD OF FABRICATING THE SAME

(75) Inventors: Mi-Ran Park, Daejeon (KR); O-Kyun Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 32 days.

(21) Appl. No.: 11/951,133

(22) Filed: Dec. 5, 2007

(65) Prior Publication Data
US 2008/0137692 A1    Jun. 12, 2008

(30) Foreign Application Priority Data

Dec. 6, 2006 (KR) .................. 10-2006-0123410
May 15, 2007 (KR) .................. 10-2007-0047284

(51) Int. Cl.
*H01S 3/04* (2006.01)
(52) U.S. Cl. .................. 372/34; 372/36; 372/46.01; 372/50.124
(58) Field of Classification Search ........... 372/34, 372/36, 46.01, 50.124
See application file for complete search history.

(56) References Cited

U.S. PATENT DOCUMENTS

| | | | | |
|---|---|---|---|---|
| 5,493,577 | A * | 2/1996 | Choquette et al. ...... | 372/46.013 |
| 5,877,038 | A * | 3/1999 | Coldren et al. ................. | 438/39 |
| 6,057,560 | A * | 5/2000 | Uchida ......................... | 257/94 |
| 6,687,281 | B2 * | 2/2004 | Coldren et al. ................. | 372/96 |
| 6,989,312 | B2 * | 1/2006 | Song et al. .................... | 438/390 |
| 2003/0086463 | A1 | 5/2003 | Shin et al. | |
| 2003/0128733 | A1 * | 7/2003 | Tan et al. ....................... | 372/96 |
| 2004/0099857 | A1 * | 5/2004 | Song et al. .................... | 257/12 |

OTHER PUBLICATIONS

Song et al., "Long-Wavelength InAlGaAs VCSELS with $Al_2C_3$ embedded current-confinement apertures," Electronic Letters, Jul. 6, 2006, vol. 42, No. 14, The Institution of Knowledge and Technology.

* cited by examiner

*Primary Examiner*—Minsun Harvey
*Assistant Examiner*—Tod T Van Roy
(74) *Attorney, Agent, or Firm*—Rabin & Berdo, P.C.

(57) ABSTRACT

Provided is a vertical cavity surface emitting device. The surface emitting device includes a lower mirror layer emitting light having a long wavelength, an active layer providing an optical gain, a tunnel junction layer for confining a current, and an upper mirror layer, which are sequentially stacked on a compound semiconductor substrate, wherein a heat release layer is formed on side surfaces of at least one of the active layer, the tunnel junction layer and the upper mirror layer by using etching process, and the heat release layer has greater thermal conductivity than at least one of the active layer, the tunnel junction layer and the upper mirror layer.

14 Claims, 6 Drawing Sheets

LONG WAVELENGTH VERTICAL CAVITY SURFACE EMITTING LASER DEVICE AND METHOD OF FABRICATING THE SAME

CROSS-REFERENCE TO RELATED PATENT APPLICATION

This application claims the benefit of Korean Patent Application No. 10-2006-0123410, filed on Dec. 6, 2006 and Korean Patent Application No. 10-2007-0047284, filed on May 15, 2007 in the Korean Intellectual Property Office, the disclosures of which are incorporated herein in their entirety by reference.

BACKGROUND OF THE INVENTION

1. Field of the Invention

The present invention relates to a surface emitting laser device and a method of fabricating the surface emitting laser device, and more particularly, to a long wavelength vertical cavity surface emitting laser device for optical communication, which has a band in the range of 1.3 to 1.6 μm, and a method of fabricating the long wavelength vertical cavity surface emitting laser device.

This work was supported by the IT R&D program of MIC/IITA. [2005-S-051-02, Photonic device integrated module for optical access network]

2. Description of the Related Art

Surface emitting laser devices emit a beam in a direction perpendicular from a top surface of a substrate, unlike edge emitting laser devices emitting asymmetrically shaped beams and having weak coupling efficiency with respect to optical fibers. Vertical-cavity surface emitting laser (VCSEL) devices, which generate output light by a vertical cavity, have a high coupling efficiency due to a circular beam shape and a low threshold current, as compared with conventional edge emitting laser devices. Since a small current of several milliamps (mA) can drive VCSEL devices, a general CMOS IC can be used to directly drive the VCSEL devices, thereby reducing the costs. The VCSEL devices can be easily fabricated as two-dimensional array devices, and can be mass-produced and tested on a wafer-by-wafer basis, unlike in the case of edge emitting laser devices. Thus, since VCSEL devices can be sufficiently mass-produced, they have been developed as a replacement of conventional laser diodes (LDs).

However, since VCSEL devices for emitting light having wavelengths in the range of 850 to 980 nm have limits with respect to a distance and velocity at which light moves through an optical fiber, these VCSEL devices are used only for local area communication, and are difficult to be used in long-distance optical communication. Accordingly, VCSEL devices for emitting light having long wavelengths in the range of 1.3 to 1.6 μm, which have a communication distance of several kilometers, have been developed as a light source that overcomes the limits of conventional VCSEL devices having a band of around 850 nm. For example, in order to ensure continuous wave operation in a temperature range of a room temperature to a high temperature of 85$\square$, and also to ensure a rapid operational velocity and a high output power, research has been conducted into various ways to achieve this, such as a method for reducing a threshold current and a series resistance, an effective heat release method, an appropriate optical inducing method and the like.

Long wavelength VCSEL devices for emitting light with a wavelength in the range of 1.3 to 1.6 μm are classified into devices including InP substrates and GaAs substrates. Thus, a mirror layer having a high reflectivity and a gain medium having a high optical gain, which are required by the long wavelength VCSEL devices, vary according to whether the InP substrate or the GaAs substrate is used.

In a device embodied on a GaAs substrate, a reflective mirror formed of a pair of GaAs/Al(Ga)As layers can be grown, wherein there is a large difference in the refractive indexes of the pair, an optical/carrier confinement structure having good performance can be embodied by using a layer generated by wet-oxidizing AlAs, and an active layer providing an output light gain has a large band-gap energy. Thus, the performance of the device does not deteriorate due to heating. An example of a GaAs-based device is a device in which an InGaAsN/GaAsN quantum well structure is used as a gain medium.

However, as nitrogen increases or the wavelength of oscillating light increases, the gain and stability of the gain medium can deteriorate, and it is difficult to obtain gain properties of a long wavelength in the range of 1.3 μm or more.

At present, surface emitting laser devices are mainly fabricated using an InGaAsP or InAlGaAs material grown on InP substrate. In the case of surface emitting layer devices including an InP substrate, it is difficult to obtain a pair of materials constituting a reflective mirror, which have a large difference between their refractive indexes. Thus, many layers needs to be grown so as to obtain a high reflectivity. For example, pairs of InAlGaAs/InAlAs layers and InAlGaAs/InP layers have been used.

In addition, since quaternary materials such as InGaAsP and InAlGaAs, which are used as materials for active layers or reflective mirrors, have low thermal conductivity corresponding to 0.1 times that of a binary material such as GaAs, the heat releasing properties of a device may deteriorate. In long wavelength VCSEL devices, a unique small band gap of a material results in a remarkable decrease in the performance of a device and an increase in the temperature. Thus, effective heat release is particularly important in long wavelength VCSEL devices.

Meanwhile, a method of manufacturing a surface emitting laser device is largely classified into a monolithic method and a hybrid method. An example of the hybrid method is a method in which an active layer providing optical gain and a mirror layer are separately grown and are then bonded to each other. In this case, by growing separate structures using separate processes (for example, a quaternary material is used as a long wavelength gain material, and a binary material such as GaAs/AlAs having a large difference in refractive indexes is used to form a mirror layer), the advantages of a GaAs substrate type laser device and an InP substrate type laser device can be mixed, and good thermal and optical properties can be obtained.

However, wafer-bonding needs to be performed in order to bond two wafers that have been epitaxially grown in different processes. Therefore, erroneous wafer bonding may occur, the reliability and mass-productivity may be reduced, and costs may increase. In other words, when wafers formed of hetero semiconductor such as GaAs and InAlGaAs are bonded or metamorphically grown, since a bonded region of the two wafers plays an electrically and optically sensitive role in a laser emitting structures reliability and mass-productivity may be reduced, and as a result, the cost of chips may increase.

Meanwhile, the monolithic method is a method in which structures such as a mirror layer and an active layer are sequentially grown on same semiconductor substrate using a semiconductor epitaxial growth method. Fabrication processes can be simplified by using the monolithic method, but heat release properties can deteriorate due to the fact that it is difficult to grow a thick mirror layer and quaternary materials are used.

SUMMARY OF THE INVENTION

The present invention provides a surface emitting device which has an advantage of increased productivity due to the use of vertical cavity surface emitting laser (VCSEL) devices and is effective at releasing generated heat and a method of manufacturing the surface emitting laser device.

According to an aspect of the present invention, there is provided a surface emitting device including a lower mirror layer emitting light having a long wavelength, an active layer providing an optical gain, a tunnel junction layer for confining a current, and an upper mirror layer which are sequentially stacked on a compound semiconductor substrate, wherein a heat release layer may be formed on side surfaces of at least one of the active layer, the tunnel junction layer and the upper mirror layer using etching process, and the heat release layer has greater thermal conductivity than at least one of the active layer, the tunnel junction layer and the upper mirror layer.

The heat release layer may include a dielectric layer and a metal layer, wherein the dielectric layer and the metal layer may be deposited on an aperture region formed on the side surface by using etching.

The dielectric layer may be formed to have a smaller thickness than the thickness of the aperture region by using atomic layer deposition (ALD) or plasma enhanced atomic layer deposition (PEALD).

The dielectric layer may be an oxide layer or a nitride layer formed of at least one of $Al_2O_3$, $SiO_2$, $SnO_2$, $TiO_2$, $ZrO_2$, $In_2O_3$, $HfO_2$ and $AlN$.

The metal layer may be formed of at least one of Cu, Al, Pd, Ru, Ti, Ta, W, TiN and TaN.

A first conducting layer formed between the lower mirror layer and the active layer, a second conducting layer formed between the active layer and the tunnel junction layer, and a third conducting layer formed between the tunnel junction layer and the upper mirror layer may be further formed so as to supply a current.

An aperture region may be formed on a side surface of at least one of the active layer, the tunnel junction layer and the upper mirror layer by selectively etching side surfaces of the active layer, the second conducting layer, the tunnel junction layer, the third conducting layer and the upper mirror layer that may be exposed using dry etching.

The diameter of the tunnel junction layer may be smaller than each of the diameters of the active layer and the upper mirror layer due to formation of an aperture region.

The substrate may be formed of InP, and the lower mirror layer, the active layer, the tunnel junction layer and the upper mirror layer may include the same kind of material as the material of the substrate.

The lower mirror layer may include a pair of InAlGaAs/InAlAs layers, the active layer may include InAlGaAs that is a multiple quantum well structure, and the upper mirror layer may include a pair of InP/InAlAs layers.

When a first conducting layer, a second conducting layer and a third conducting layer, through which a current is supplied, may be further formed, the first conducting layer, the second conducting layer and the third conducting layer may respectively include n-InP, p-InP and n-InP, which are sequentially stacked.

According to an aspect of the present invention, there is provided a method of fabricating a surface emitting device, including: sequentially forming, on a compound semiconductor substrate, a lower mirror layer emitting a laser beam having a long wavelength, a first conducting layer to which a current is supplied, an active layer providing optical gain, a second conducting layer, a tunnel junction layer for confining a current, a third conducting layer and an upper mirror layer; exposing side surfaces of the active layer, the second conducting layer, the tunnel junction layer, the third conducting layer and the upper mirror layer using dry etching; forming an aperture region by selectively wet-etching a side surface of at least one of the active layer, the tunnel junction layer and the upper mirror layer; disposing, in the aperture region, a heat release layer having a greater thermal conductivity than at least one of the active layer, the tunnel junction layer and the upper mirror layer.

The heat release layer may be formed by depositing a dielectric layer on the aperture region and then depositing a metal layer on the dielectric layer.

The dielectric layer may be formed to have a smaller thickness than the thickness of the aperture region by using atomic layer deposition (ALD) or plasma enhanced atomic layer deposition (PEALD).

The diameter of the tunnel junction layer may be smaller than each of the diameters of the active layer and the upper mirror layer due to formation of the aperture region.

The substrate may be formed of InP, and the lower mirror layer, the active layer, the tunnel junction layer and the upper mirror layer may include the same kind of material as the material of the substrate.

The lower mirror layer may include a pair of InAlGaAs/InAlAs layers, the active layer may include InAlGaAs that is a multiple quantum well structure, and the upper mirror layer may include a pair of InP/InAlAs layers.

The first conducting layer, the second conducting layer and the third conducting layer may respectively include n-InP, p-InP and n-InP, which are sequentially stacked.

According to the present invention, problems of the conventional art can be overcome. These problems are as follows. A conventional surface emitting device is technologically complicated. For example, when a mirror layer material and an active layer material are separately grown, and then wafers are wafer-bonded in a following operation, or the wafers are metamorphically grown, and then a dielectric mirror layer is coupled to the wafers, reliability may deteriorate due to crystal defects or plastic deformation. The present invention can overcome these problems.

The present invention can realize a long wavelength vertical cavity surface emitting laser as a lattice matched crystal growth structure having high reliability and ability to overcome the limitation of the material forming the conventional surface emitting device having a low thermal conductivity.

According to the present invention, a device is fabricated so that a stable connection is achieved between layers including the same kind of materials, instead of a connection between layers including different kinds of materials in order to improve thermal properties. An aperture region of an air layer is formed on a heating portion, and then a dielectric layer having high thermal conductivity and a metal layer are deposited on the aperture region, and thus a laser can be easily used to emit heat, and operational properties and reliability can be improved.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art.

FIGS. 1 through 5 are cross-sectional views of a surface emitting layer device and are for explaining a method of fabricating the surface emitting layer device, according to embodiments of the present invention.

Figure 1:
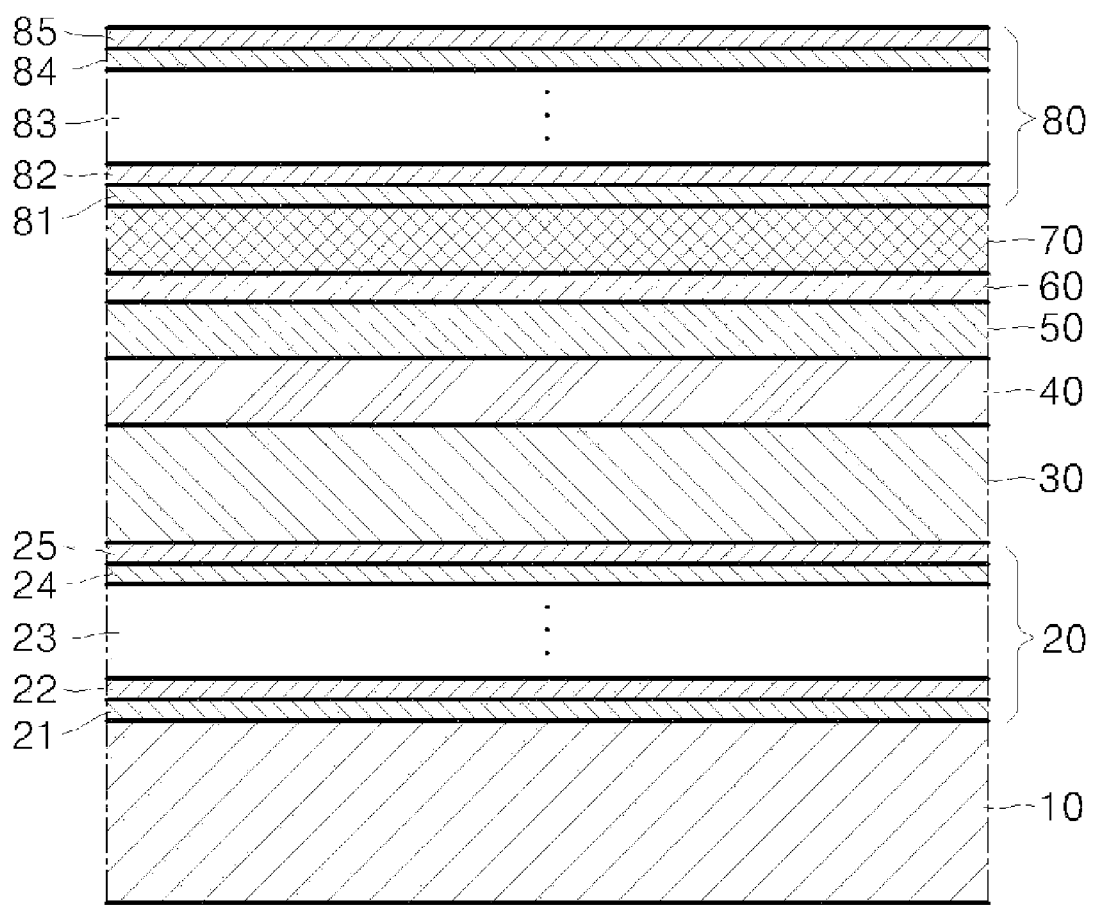
FIGS. 1 through 5 are cross-sectional views of a surface emitting layer device and are for explaining a method of fabricating the surface emitting layer device, according to embodiments of the present invention.

Referring to FIG. 1, a lower mirror layer 20, an active layer 40, a tunnel junction layer 60 and an upper mirror layer 80 are sequentially grown on a compound semiconductor substrate 10 by using an epitaxial growth method. At this time, a first conducting layer 30 may be further formed between the lower mirror layer 20 and the active layer 40, a second conducting layer 50 may be further formed between the active layer 40 and the tunnel junction layer 60, and a third conducting layer 70 may be formed between the tunnel junction layer 60 and the upper mirror layer 80. The first conducting layer 30, the second conducting layer 50 and the third conducting layer 70 may function as conducting layers for spreading current, and may be formed of a material having better heat release properties than those of surrounding layers. The compositions of the tunnel junction layer 60, the active layer 40, and the lower and upper mirror layers 20 and 80 are determined based on their use in a surface emitting laser device.

The tunnel junction layer 60 is a region for reducing an absorption loss of free carrier, and may comprise a p-n junction structure.

The active layer 40 is a gain medium providing gain to an operation of a laser, and may be a multiple quantum well formed of InAlGaAs.

The compound semiconductor substrate 10 is formed of InP which is a binary material having a high thermal conductivity. Unlike a conventional method in which an InP substrate and a GaAs based mirror layer are wafer-bonded to each other, the lower mirror layer 20, the active layer 40, the tunnel junction layer 60, the upper mirror layer 80, the first conducting layer 30, the second conducting layer 50 and the third conducting layer 70 are formed of the same kind of material as the InP substrate 10, and are simultaneously epitaxial-grown on the InP substrate 10. Accordingly, every layer constituting a surface emitting device according to the present invention is grown on the InP substrate 10 by using lattice matching.

The lower mirror layer 20 is formed by stacking a pair of InAlGaAs/InAlAs layers, thereby obtaining high reflectivity. The upper mirror layer 80 is formed by stacking a pair of InP/InAlAs layers, thereby obtaining high reflectivity. The reflectivity of the lower mirror layer 20 is smaller than that of the upper mirror layer 80. Accordingly, a laser beam is emitted from a surface of the lower mirror layer 20. The lower mirror layer 20 is formed by epitaxially grown various layers denoted by reference numbers 21 through 25 so as to obtain a high refractive index. The lower mirror layer 20 may be formed of a pair of InAlGaAs and InAlAs layers, wherein there is a large difference between the refractive indexes of the pair. Two layers having different refractive indexes from each other are alternately stacked, thereby obtaining desired optical reflective properties. For example, if each layer denoted by reference numbers 21 and 25 is an InAlGaAs layer having a high refractive index, each layer denoted by reference numbers 22 and 24 is an InAlAs layer having a low refractive index.

The upper mirror layer 80 is formed by epitaxially growing various layers denoted by reference numbers 81 through 85, like in the formation of the lower mirror layer 20. The upper mirror layer 80 may be formed of materials having refractive indexes that differ greatly from one another, and may be formed by alternately stacking InAlAs and InP layers so as to have a selectivity with respect to wet etching process in order to form an aperture region (89 of FIG. 4).

The first through third conducting layers 30, 50 and 70 may include InP(n-InP) doped with an n-type material and InP(p-InP) doped with a p-type material which are alternately stacked in a predetermined stack order. For example, n-InP, p-InP and n-InP may be sequentially stacked.

Figure 2:
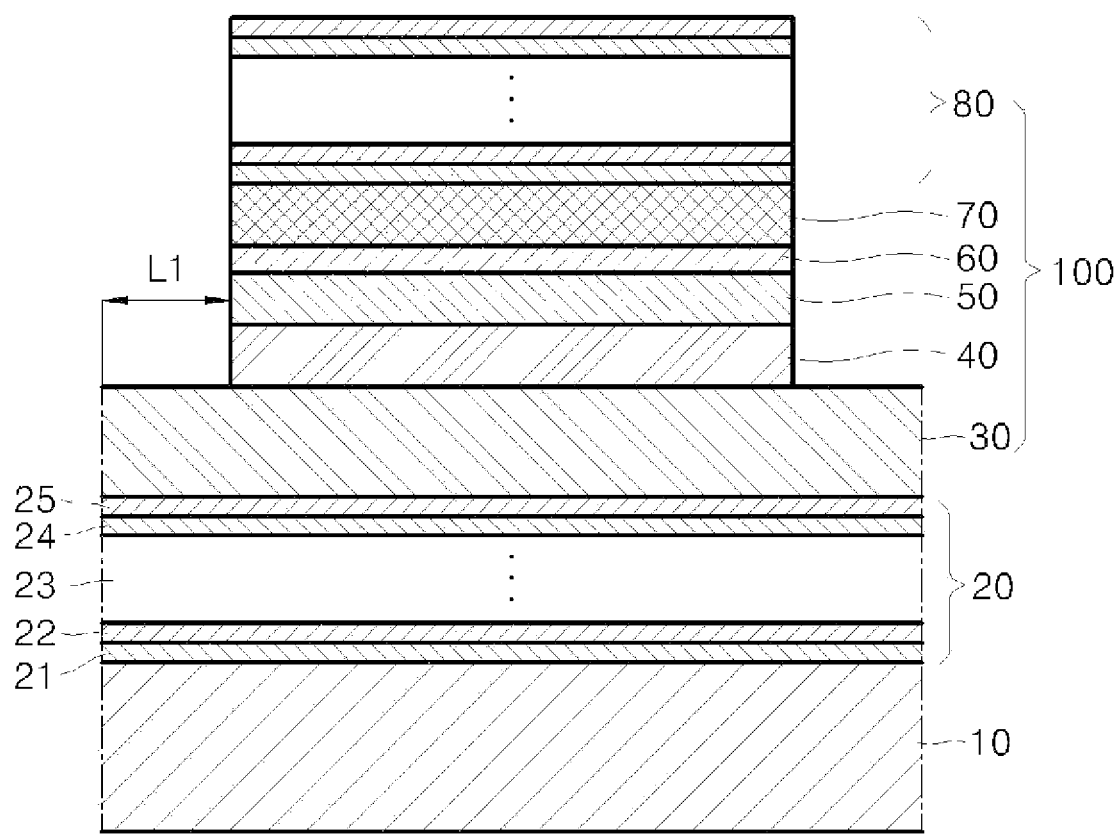
Figure 3:
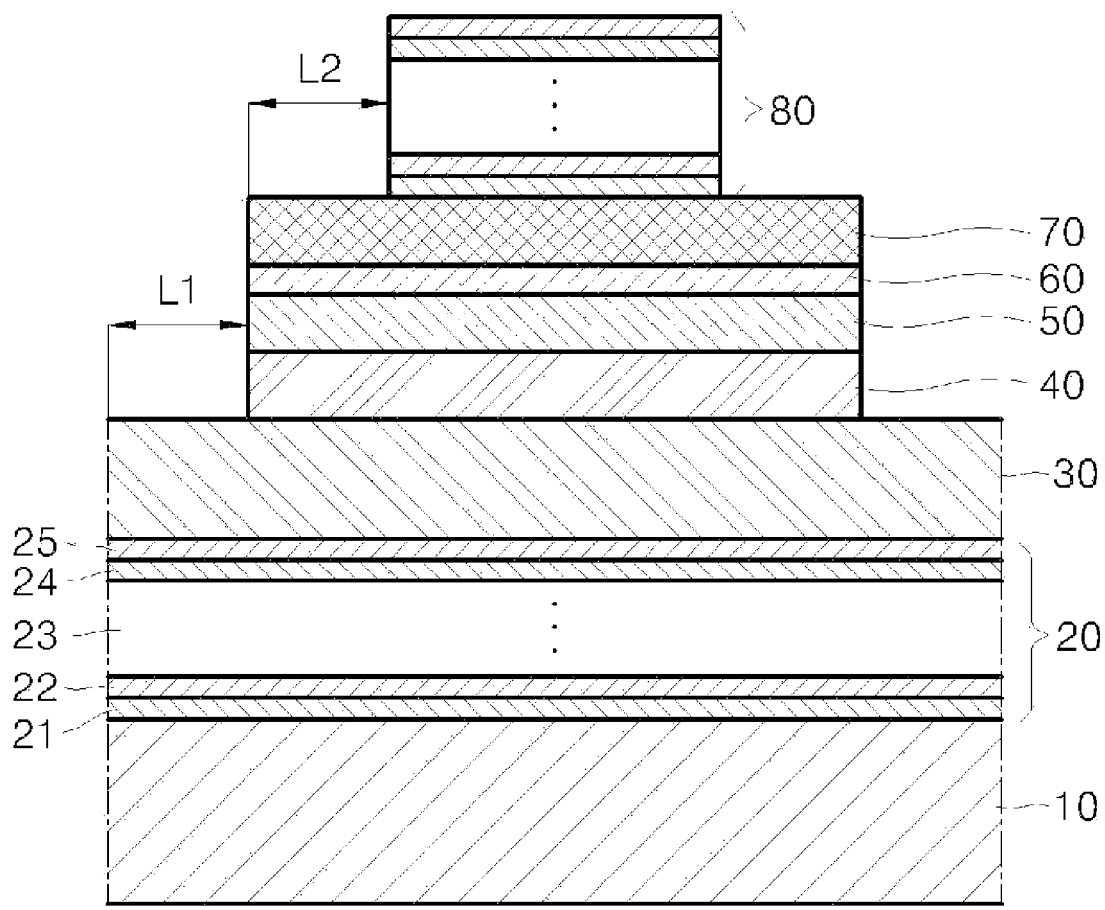
Figure 4:
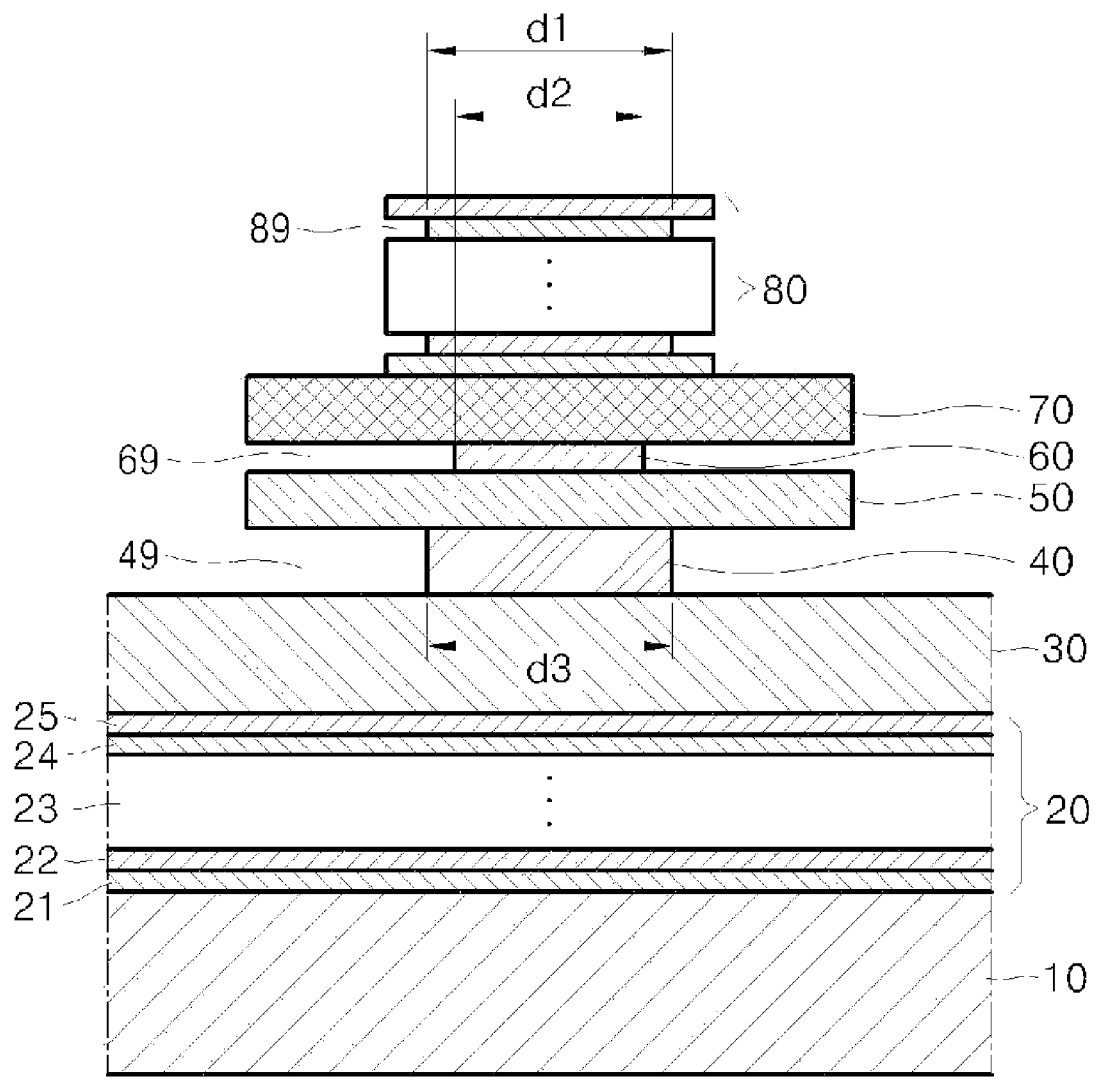

Referring to FIGS. 2 and 3, side surfaces of the active layer 40, the second conducting layer 50, the tunnel junction layer 60, the third conducting layer 70 and the upper mirror layer 80 are exposed by dry-etching process. That is, an epitaxial structure is completed for a surface emitting laser, as illustrated in FIG. 1, and then general photolithography and dry etching are used in order to form an air post pattern having widths L1 and L2, as illustrated in FIGS. 2 and 3. SiN or the like is used as a mask, and then $CH_4$ or $H_2$ based ions can be used as etching ions.

When the side surfaces of the active layer 40, the second conducting layer 50, the tunnel junction layer 60, the third conducting layer 70 and the upper mirror layer 80 are exposed, parts of the side surfaces of the active layer 40, the tunnel junction layer 60 and the upper mirror layer 80 are removed by performing selective wet etching so as to form aperture regions 49, 69 and 89. At this time, the diameter d3 of the active layer 40 and the diameter d1 of the upper mirror layer 80 are each greater than the diameter d2 of the tunnel junction layer 60 that has a current confinement structure, so as to allow photo-induction of a laser. Accordingly, relative depths of the aperture region 69 formed on a side surface of the tunnel junction layer 60, of the aperture region 89 formed on a side surface of the upper mirror layer 80, and of the aperture region 49 formed on a side surface of the active layer 40 are adjusted.

Figure 5:
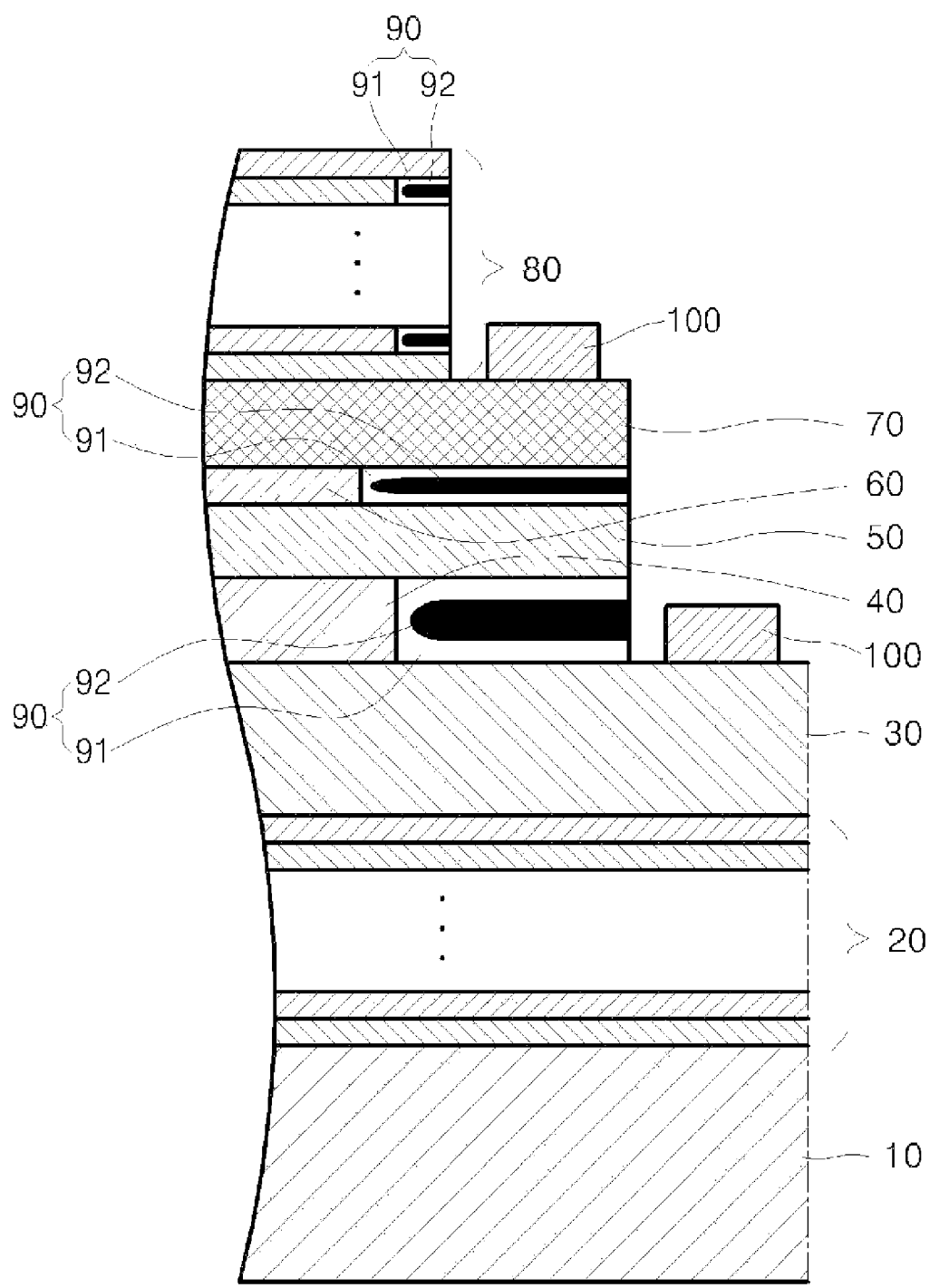

FIG. 5 is a cross-sectional view illustrating a case where a dielectric layer 91 and a metal layer 92 having good thermal conductivity are sequentially deposited on regions of the aperture regions 49, 69 and 89 that are formed by performing selective wet etching, according to an embodiment of the present invention. A heat release layer 90 includes the dielectric layer 91 and the metal layer 92. An oxide layer or a nitride layer having good thermal conductivity is formed in the aperture regions 49, 69 and 89 by using atomic layer deposition (ALD) or plasma enhanced atomic layer deposition (PEALD) in such a manner that the thickness of the oxide layer or the nitride layer may be smaller than each of the thicknesses of the aperture regions 49, 69 and 89, taking narrow spaces of the aperture regions 49, 69 and 89 into consideration. Then, the metal layer 92 having good thermal conductivity is deposited so as to fill in the aperture regions 49, 69 and 89.

The dielectric layer 91 may be formed of an oxide layer such as $Al_2O_3$, $SiO_2$, $SnO_2$, $TiO_2$, $ZrO_2$, $In2O_3$, $HfO_2$ or the like, or AlN or the like. The metal layer 92 may be formed of Cu which has good thermal conductivity, or alternatively may be formed of Al, Pd, Ru, Ti, Ta, W, TiN, TaN or the like. An electrode 100 may be provided as an ohmic contact through which a current is supplied to the first conducting layer 30 and the third conducting layer 70.

Figure 6:
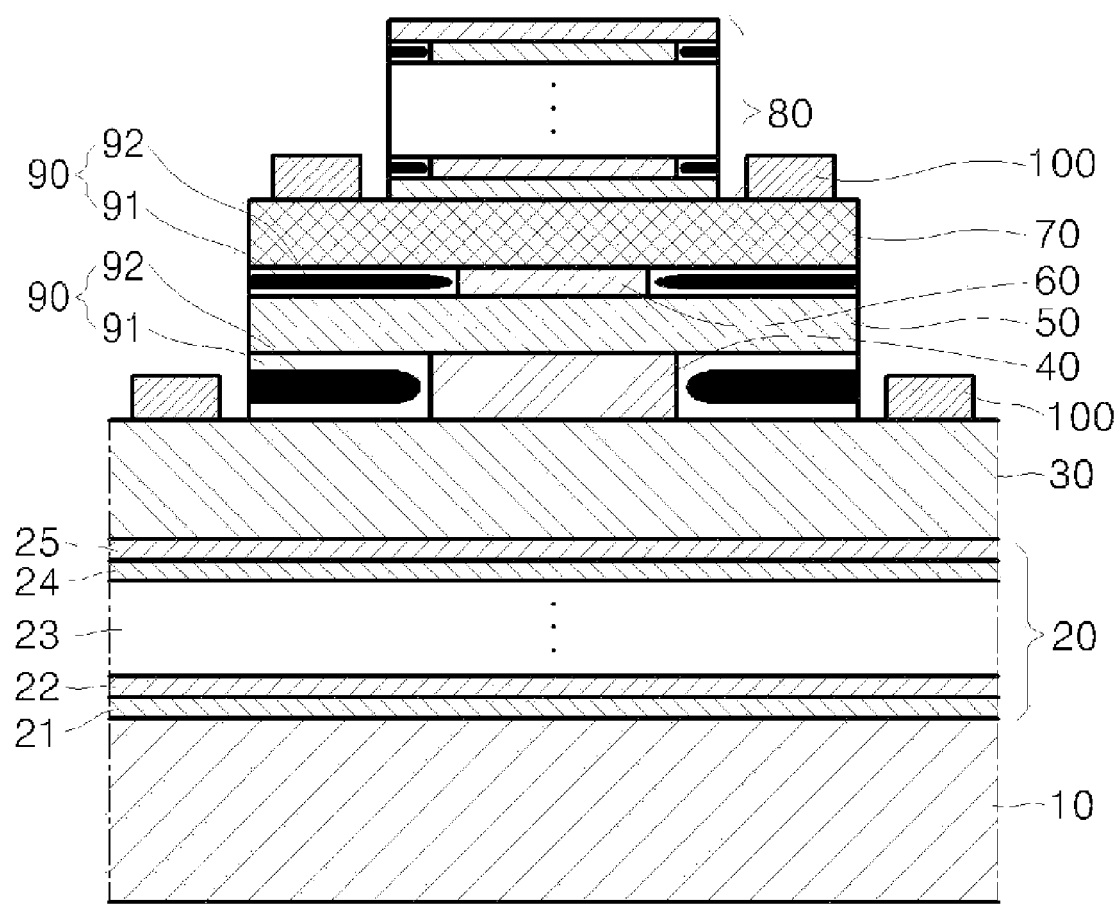
FIG. 6 is a cross-sectional view of a completed structure of a surface emitting device according to an embodiment of the present invention.

FIG. 6 is a cross-sectional view of a completed structure of a surface emitting device according to an embodiment of the present invention. The structure of FIG. 1 is grown on a wafer having a general size to perform the method illustrated in FIGS. 2 through 5. Then, wafer dicing is performed to obtain many devices which are each respectively the same as the device illustrated in FIG. 6. An output beam of the surface emitting laser fabricated by using the above method may be emitted downwards through the lower mirror layer 20. Although the substrate 10 is illustrated, a part of or the entire substrate 10 may be removed in order to more easily emit a laser beam through a surface of the lower mirror layer 20. Due to the heat release layer 90, heat generated by the laser, which continually operates between a room temperature and a high temperature, can be effectively released, and deterioration of the performance of the device due to generated heat can be prevented.

Advantages of the surface emitting device according to the present invention and the method of fabricating the same, are as follows. Compared with a conventional method in which wafers formed of hetero semiconductors are bonded to each other, when the method of the present invention is used, errors due to wafer bonding can be prevented, and economic feasibility and productivity can be improved, in which the same materials are simultaneously epitaxially grown. Also, since every layer is grown by using lattice matching, the performance and reliability of the device can be improved. The device is formed of an InP based material suitable for a long wavelength, wherein a heat release layer is formed by performing selective wet etching process and atomic layer deposition, and thus the thermal properties of a quaternary material can be prevented from deteriorating. In addition, since heat release properties are improved compared with a conventional surface emitting laser in the long wavelength range, stable operational properties of a laser can be obtained at ambient and high temperatures.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A surface emitting device comprising a lower mirror layer emitting light having a long wavelength, an active layer providing an optical gain, a tunnel junction layer for reducing an absorption loss of free carrier, and an upper mirror layer, which are sequentially stacked on a compound semiconductor substrate, wherein an aperture region is formed on a side surface of at least one of the active layer, the tunnel junction layer and the upper mirror layer by using etching process, and a heat release layer having greater thermal conductivity than at least one of the active layer, the tunnel junction layer and the upper mirror layer is formed in the aperture region, wherein the heat release layer comprises a dielectric layer and a metal layer, wherein the dielectric layer is deposited on an aperture region and the metal layer is deposited on the dielectric layer formed on the side surface, and wherein the dielectric layer is formed to have a smaller thickness than the thickness of the aperture region by using atomic layer deposition (ALD) or plasma enhanced atomic layer deposition (PEALD).

2. The device of claim 1, wherein the dielectric layer is an oxide layer or a nitride layer formed of at least one of $Al_2O_3$, $SiO_2$, $SnO_2$, $TiO_2$, $ZrO_2$, $In_2O_3$, $HfO_2$ and AlN.

3. The device of claim 1, wherein the metal layer is formed of at least one of Cu, Al, Pd, Ru, Ti, Ta, W, TiN and TaN.

4. The device of claim 1, wherein a first conducting layer formed between the lower mirror layer and the active layer, a second conducting layer formed between the active layer and the tunnel junction layer, and a third conducting layer formed between the tunnel junction layer and the upper mirror layer are further formed so as to spread a current.

5. The device of claim 4, wherein the aperture region is formed on a side surface of at least one of the active layer, the tunnel junction layer and the upper mirror layer by selectively etching side surfaces of the active layer, the second conducting layer, the tunnel junction layer, the third conducting layer and the upper mirror layer that are exposed by using dry etching process.

6. The device of claim 1, wherein the substrate is formed of InP, and the lower mirror layer, the active layer, the tunnel junction layer and the upper mirror layer comprises the same kind of material as the material of the substrate.

7. A surface emitting device comprising a lower mirror layer emitting light having a long wavelength, an active layer providing an optical gain, a tunnel junction layer for reducing an absorption loss of free carrier, and an upper mirror layer, which are sequentially stacked on a compound semiconductor substrate, wherein an aperture region is formed on a side surface of at least one of the active layer, the tunnel junction layer and the upper mirror layer by using etching process, and a heat release layer having greater thermal conductivity than at least one of the active layer, the tunnel junction layer and the upper mirror layer is formed in the aperture region, wherein the diameter of the tunnel junction layer is smaller than each of the diameters of the active layer and the upper mirror layer due to formation of the aperture region.

8. The device of claim 7, wherein the heat release layer comprises a dielectric layer and a metal layer, wherein the dielectric layer is deposited on an aperture region and the metal layer is deposited on the dielectric layer formed on the side surface.

9. The device of claim 7, wherein the substrate is formed of InP, and the lower mirror layer, the active layer, the tunnel junction layer and the upper mirror layer comprises the same kind of material as the material of the substrate.

10. The device of claim 7, wherein a first conducting layer formed between the lower mirror layer and the active layer, a second conducting layer formed between the active layer and the tunnel junction layer, and a third conducting layer formed between the tunnel junction layer and the upper mirror layer are further formed so as to spread a current.

11. A surface emitting device comprising a lower mirror layer emitting light having a long wavelength, an active layer providing an optical gain, a tunnel junction layer for reducing an absorption loss of free carrier, and an upper mirror layer, which are sequentially stacked on a compound semiconductor substrate, wherein an aperture region is formed on a side surface of at least one of the active layer, the tunnel junction aver and the upper mirror layer by using etching process, and a heat release layer having greater thermal conductivity than at least one of the active layer, the tunnel junction layer and the upper mirror layer is formed in the aperture region, wherein the substrate is formed of InP, and the lower mirror layer, the active layer, the tunnel junction layer and the upper mirror layer comprises the same kind of material as the material of the substrate, and wherein the lower mirror layer comprises a pair of InAlGaAs/InAlAs layers, the active layer comprises a InAlGaAs-based multiple quantum well structure, and the upper mirror layer comprises a pair of InP/InAlAs layers.

12. The device of claim 11, wherein when a first conducting layer, a second conducting layer and a third conducting layer, through which a current is supplied, are further formed, the first conducting layer, the second conducting layer and the third conducting layer respectively comprise n-InP, p-InP and n-InP, which are sequentially stacked.

13. The device of claim 11, wherein the heat release layer comprises a dielectric layer and a metal layer, wherein the dielectric layer is deposited on an aperture region and the metal layer is deposited on the dielectric layer formed on the side surface.

14. The device of claim 11, wherein a first conducting layer formed between the lower mirror layer and the active layer, a second conducting layer formed between the active layer and the tunnel junction layer, and a third conducting layer formed between the tunnel junction layer and the upper mirror layer are further formed so as to spread a current.

* * * * *